(12) United States Patent
Kautzsch et al.

(10) Patent No.: US 8,921,954 B2
(45) Date of Patent: Dec. 30, 2014

(54) METHOD OF PROVIDING A SEMICONDUCTOR STRUCTURE WITH FORMING A SACRIFICIAL STRUCTURE

(71) Applicant: Infineon Technologies AG, Neubiberg (DE)

(72) Inventors: Thoralf Kautzsch, Dresden (DE); Stefan Kolb, Unterschleissheim (DE); Boris Binder, Dresden (DE); Bernd Foeste, Dresden (DE); Marco Mueller, Pirna (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/973,159

(22) Filed: Aug. 22, 2013

(65) Prior Publication Data
US 2013/0334624 A1  Dec. 19, 2013

Related U.S. Application Data

(62) Division of application No. 12/976,433, filed on Dec. 22, 2010, now Pat. No. 8,518,732.

(51) Int. Cl.
| | | |
|---|---|---|
| *H01L 29/84* | (2006.01) | |
| *H01L 21/00* | (2006.01) | |
| *H01L 21/311* | (2006.01) | |
| *B81C 1/00* | (2006.01) | |
| *G01L 9/00* | (2006.01) | |
| *B81B 3/00* | (2006.01) | |
| *G01L 19/06* | (2006.01) | |
| *H04R 31/00* | (2006.01) | |
| *H04R 19/00* | (2006.01) | |
| *H04R 19/04* | (2006.01) | |

(52) U.S. Cl.
CPC ............ *B81B 3/0021* (2013.01); *B81C 1/00158* (2013.01); *G01L 9/0045* (2013.01); *H04R 31/00* (2013.01); *H01L 29/84* (2013.01); *H04R 19/005* (2013.01); *G01L 19/0636* (2013.01); *H04R 19/04* (2013.01)

USPC ............................. 257/415; 438/48; 438/700

(58) Field of Classification Search
USPC ............ 438/48–50, 700–703, 478, 151, 268, 438/585, 586, 694, 301, 53, 591, 124, 138, 438/14, 157, 158, 173, 197, 217, 24, 26, 438/275, 276, 28, 287, 299, 311, 33, 350, 438/52, 525, 571, 589, 592, 595, 598, 637, 438/65, 669, 696, 7, 702, 763; 73/715–728, 73/754; 257/415, E21.577, E21.585
See application file for complete search history.

(56) References Cited

U.S. PATENT DOCUMENTS

| | | |
|---|---|---|
| 5,266,827 A | 11/1993 | Kato |
| 5,343,064 A | 8/1994 | Spangler et al. |

(Continued)

FOREIGN PATENT DOCUMENTS

| | | |
|---|---|---|
| CN | 1808086 A | 7/2006 |
| DE | 230079 A1 | 11/1985 |
| WO | 2008027143 A2 | 3/2008 |

OTHER PUBLICATIONS

Office Action dated Sep. 6, 2013 for U.S. Appl. No. 12/898,221.

(Continued)

*Primary Examiner* — Hsien Ming Lee
(74) *Attorney, Agent, or Firm* — Eschweiler & Associates, LLC

(57) ABSTRACT

A method for providing a semiconductor structure includes forming a sacrificial structure by etching a plurality of trenches from a first main surface of a substrate. The method further includes covering the plurality of trenches at the first main surface with a cover material to define cavities within the substrate, removing a part of the substrate from a second main surface opposite to the first main surface to a depth at which the plurality of trenches are present, and etching away the sacrificial structure from the second main surface of the substrate.

9 Claims, 13 Drawing Sheets

(56) References Cited

U.S. PATENT DOCUMENTS

| | | |
|---|---|---|
| 5,531,121 A | 7/1996 | Sparks et al. |
| 5,659,196 A | 8/1997 | Honda |
| 6,012,336 A | 1/2000 | Eaton et al. |
| 6,229,190 B1 | 5/2001 | Bryzek et al. |
| 6,331,470 B1 | 12/2001 | Sanfilippo et al. |
| 6,387,772 B1 | 5/2002 | Chittipeddi et al. |
| 6,704,185 B2 | 3/2004 | Chatzandroulis et al. |
| 6,939,474 B2 | 9/2005 | Eldridge et al. |
| 7,004,034 B2 | 2/2006 | Chen |
| 7,207,227 B2 | 4/2007 | Rangsten et al. |
| 7,329,933 B2 | 2/2008 | Zhe et al. |
| 7,402,449 B2 | 7/2008 | Fukuda et al. |
| 7,533,463 B2 | 5/2009 | Conta et al. |
| 7,555,956 B2 | 7/2009 | Benzel et al. |
| 7,799,588 B2 * | 9/2010 | Oohara et al. .......... 438/31 |
| 7,832,279 B2 * | 11/2010 | Kautzsch et al. ........ 73/754 |
| 7,874,333 B2 * | 1/2011 | Durand ............ 152/209.22 |
| 8,471,346 B2 * | 6/2013 | Kautzsch et al. ........ 257/415 |
| 2003/0068838 A1 | 4/2003 | Shie et al. |
| 2003/0192383 A1 | 10/2003 | Chen |
| 2004/0219705 A1 | 11/2004 | Corso |
| 2005/0202607 A1 | 9/2005 | Furukawa et al. |
| 2006/0001124 A1 * | 1/2006 | Ayazi et al. .......... 257/531 |
| 2006/0093171 A1 | 5/2006 | Zhe et al. |
| 2007/0177287 A1 | 8/2007 | Oka et al. |
| 2008/0038921 A1 * | 2/2008 | Gouda et al. .......... 438/689 |
| 2008/0128840 A1 | 6/2008 | Benzel |
| 2008/0178681 A1 | 7/2008 | Asada et al. |
| 2009/0266170 A1 | 10/2009 | Murashige et al. |
| 2010/0002543 A1 | 1/2010 | Schlosser et al. |
| 2010/0055821 A1 | 3/2010 | Buehler et al. |
| 2010/0058876 A1 * | 3/2010 | Kautzsch et al. ........ 73/754 |
| 2011/0068420 A1 | 3/2011 | Binder et al. |
| 2011/0140216 A1 | 6/2011 | Qu |
| 2011/0163395 A1 * | 7/2011 | Kautzsch et al. ........ 257/415 |
| 2011/0163398 A1 | 7/2011 | Laermer et al. |
| 2012/0068277 A1 | 3/2012 | Kautzsch et al. |
| 2014/0227818 A1 | 8/2014 | Binder et al. |

OTHER PUBLICATIONS

U.S. Appl. No. 12/208,897, filed Sep. 11, 2008. 22 Pages.
Non-Final Office Action dated Jan. 28, 2010 for U.S. Appl. No. 12/208,897. 6 Pages.
Notice of Allowance dated Jul. 13, 2010 for U.S. Appl. No. 12/208,897. 5 Pages.
Non-Final Office Action dated Jul. 19, 2012 for U.S. Appl. No. 12/976,433. 11 Pages.
Final Office Action dated Jan. 7, 2013 for U.S. Appl. No. 12/976,433. 18 Pages.
Notice of Allowance dated Apr. 30, 2013 for U.S. Appl. No. 12/976,433. 10 Pages.
U.S. Appl. No. 12/898,221, filed Oct. 5, 2010. 48 Pages.
Non-Final Office Action dated Sep. 12, 2012 for U.S. Appl. No. 12/898,221. 8 Pages.
Final Office Action dated Feb. 22, 2013 for U.S. Appl. No. 12/898,221. 8 Pages.
Notice of Allowance dated Jan. 6, 2014 for U.S. Appl. No. 12/898,221. 18 Pages.

* cited by examiner

METHOD OF PROVIDING A SEMICONDUCTOR STRUCTURE WITH FORMING A SACRIFICIAL STRUCTURE

REFERENCE TO RELATED APPLICATION

This application is a Divisional of U.S. application Ser. No. 12/976,433 filed on Dec. 22, 2010.

BACKGROUND

A number of applications in the field of micro-electronics require structuring semiconductor substrates down to deep regions of the substrate. Examples of these applications can be found in the field of power electronics (high voltage components), the field of sensory devices, micro-electromechanical systems (MEMS), etc. The deep structuring of the semiconductor substrate is sometimes referred to as "3D Integration". Creating cavities and/or recesses in the semiconductor substrate typically requires etching the substrate from one of its main surfaces, or depositing new matter on the main surface of the semiconductor substrate while masking the site or location of the future cavity or recess. Particularly when the cavities are obtained by means of an etching process, the dimensions of the cavities are subject to constraints imposed by the etching process. For example, the so-called "Deep Trench" etching process obeys a relatively fixed relation between a width of a trench to be etched and a depth of this trench. In cases where the closed cavity or a partly closed cavity is to be obtained within the substrate, the creation of a cover layer to close the cavity typically requires extensive manufacturing methods, due to the large dimensions of the cavities which cannot be closed with conventional semiconductor manufacturing technologies in a satisfactory manner.

The manufacturing of a pressure sensor shall illustrate the encountered problems in a representative manner for all types of applications requiring a similar 3D structuring of a semiconductor substrate. Pressure sensors are typically used to measure the pressure of a liquid or a gas, such as air. Pressure sensors typically provide an output signal that varies, based on the pressure sensed by the pressure sensor. One type of pressure sensor includes a standalone pressure sensor that is coupled to, or bonded to, a sensor surface, such as an application specific integrated circuit (ASIC). This type of pressure sensor is expensive to fabricate. Connecting this type of pressure sensor to a sensor circuit is also expensive. Another type of pressure sensor is a pressure capsule (e.g. a polysilicon plate) that is integrated with a sensor circuit, such as an ASIC, during a back-end-of-line (BEOL) process. This type of pressure sensor is also expensive to produce, since several additional mask levels are required to fabricate the pressure sensor.

Semiconductor structures manufactured by 3D integration often require an electrical insulation between different parts of the semiconductor structure. This requires creating or providing an insulating region possibly deep within the semiconductor substrate so that conventional surface-oriented methods such as doping are unsuitable.

SUMMARY

One embodiment of the invention addresses a method for providing a semiconductor structure, the method comprising forming a sacrificial structure by etching a plurality of trenches from a first main surface of a substrate. The method further comprises covering the plurality of trenches at the first main surface with a cover material to define cavities within the substrate; removing a part of the substrate from a second main surface opposite to the first main surface to a depth at which the plurality of trenches are present; and etching away the sacrificial structure from the second main surface of the substrate.

BRIEF DESCRIPTION OF THE DRAWINGS

The accompanying drawings are included to provide a further understanding of embodiments and are incorporated in and constitute a part of this specification. The drawings illustrate embodiments and, together with the description, serve to explain principles of the embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following detailed description, reference is made to the accompanying drawings, which form a part hereof, and in which is shown by way of illustration specific embodiments in which the invention may be practiced. In this regard, directional terminology such a "top" and "bottom", "front" and "back", "leading", "trailing", etc., is used with reference to the orientation of the Figure(s) being described. As components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1A:
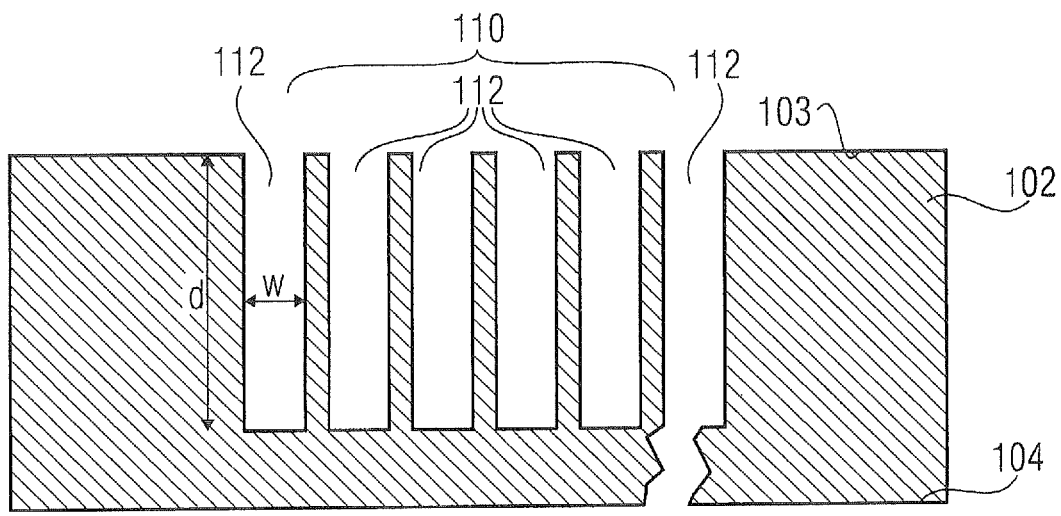
FIGS. 1A to 1D illustrate various stages of an embodiment of a manufacturing process of a semiconductor structure.

FIGS. 1A to 1D illustrate various stages of a method for providing a semiconductor structure 100 in four sub-drawings. FIG. 1A shows a result of an etching process performed on a first main surface 103 of a semiconductor substrate 102. The etching process creates a plurality of trenches 112 that extend from the first main surface 103 to a depth d within the substrate 102. The etching of the trenches 112 may be performed by the deep trench (DT) process. The deep trench etching process results in relatively steep walls of the plurality of trenches 112. The depth d of the plurality of trenches 112 can be controlled by selecting a width w of each one of the plurality of trenches 112. Accordingly, the plurality of trenches 112 will have approximately the same width w, if a substantially uniform depth d of the plurality of trenches is desired.

The etching on the plurality of trenches 112 results in a sacrificial structure 110 being formed. The sacrificial structure 110 comprises substrate material left over after the etching of the plurality of trenches 112 between two of the plurality of trenches 112 has taken place. Typically, the spacing of the plurality of trenches 112 is relatively narrow so that the sacrificial structure 110 comprises one or more thin walls between the trenches. FIG. 1A illustrates the sacrificial structure 110 as a field of silicon lamellae. Note that the FIGS. 1A to 1D are broken at the right-most trench for the sake of illustration. The plurality of trenches 112 and the sacrificial structure 110 could extend further to the right of the substrate 102 in FIGS. 1A to 1D. A lateral extension (i.e., in the left-right direction in FIGS. 1A to 1D) of the plurality of trenches 112 could be 1 µm, 10 µm, 100 µm, or 1000 µm and assume values between the mentioned values or even outside of the mentioned range of 1 µm to 1000 µm. The length of the trenches 112 in a direction perpendicular to the drawing plane is typically not substantially limited by constraints.

The etching of the plurality of trenches 112 can be used to structure the substrate 102 with an arrangement of sacrificial (sub-)structures. The shape and dimensions of the arrangement of the sacrificial (sub-)structures can be relatively precisely controlled in the two lateral directions parallel to the first main surface on the die of the substrate 102 and even, to some extent, in the third direction, e.g. the direction of the depth d of the plurality of trenches 112. The sacrificial structure 110 and/or the arrangement of sacrificial (sub-)structures may be regarded as an auxiliary or intermediate means for ultimately obtaining a larger structure in the semiconductor substrate 102, such as a cavity or a recess.

Figure 1B:
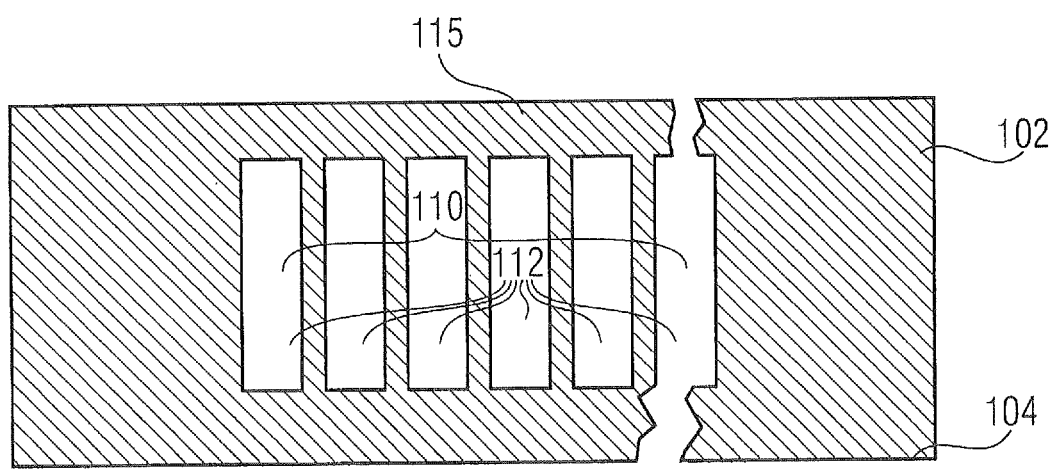

FIG. 1B shows another stage of the method of providing a semiconductor structure. The plurality of trenches 112 have been covered at the first main surface 103 with a cover material 115 to define cavities within the substrate 102. The covering of the plurality of trenches 112 may be achieved by an epitaxial process or a Venetia process, for example. The cover material 115 may be identical to the material of the substrate 102, e.g. silicon or another semiconductor material. Alternatively, the cover material 115 may be different from the substrate material, such as silicon oxide, a metal, an oxide of a metal, or even a polymer. The walls or lamellae that are a part of the sacrificial structure 110 support the cover material 115 so that the cover material 115 substantially remains at the first main surface 103 of the substrate 102, instead of collapsing to the bottom of the plurality of trenches 112. One of several options for covering the plurality of trenches 112 is to use an H-bake process The H-bake process makes it possible to cover even relatively large trenches with the cover material 115 such that the plurality of trenches 112 are completely closed at their extremities that used to be open to the first main surface 103.

Figure 1C:
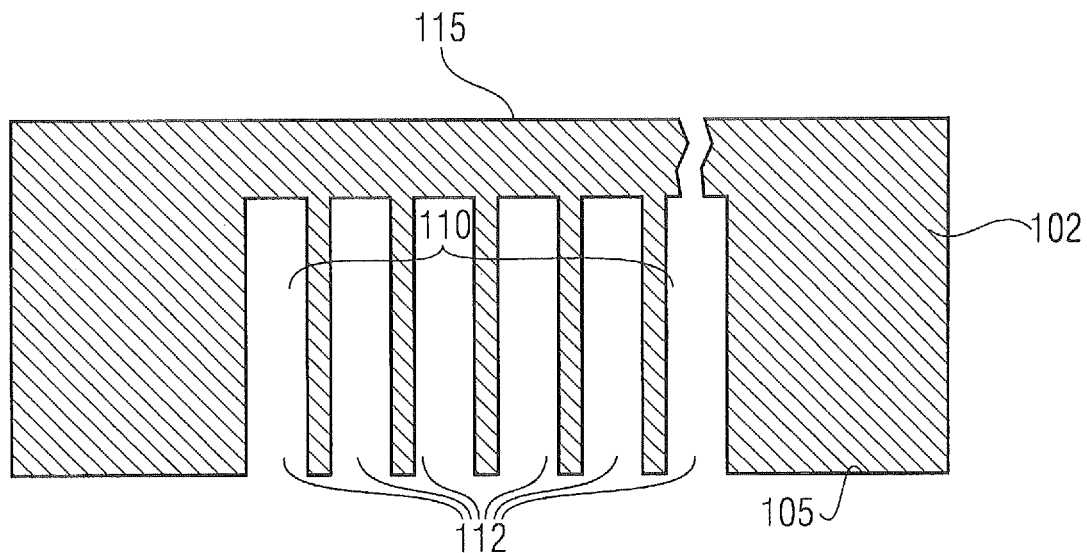

FIG. 1C shows a result of yet another stage of the method for providing the semiconductor structure. The substrate 102 has been processed starting out from the second main surface 104 (FIG. 1B) by removing a part of the substrate, thus thinning the substrate. Processes used for thinning the substrate 102 typically comprise mechanically grinding the substrate 102 or a chemical-mechanical polishing (CMP) process. The thinning of the substrate 102 thus results in the creation of a new second main surface 105 (FIG. 1C). The removal of the part of the substrate 102 typically affects a layer of the substrate 102 that has a thickness sufficient for the plurality of trenches 112 to appear after the completion of the removal. In other words, the removal of a substrate material extends at least from the former second main surface 104 to the depth d at which the plurality of the trenches are present. The plurality of trenches 112 has extremities which are open to the new second main surface 105.

Note that there is typically a standard semiconductor device manufacturing process interposed between the stages illustrated by FIGS. 1B and 1C. The standard semiconductor manufacturing process comprises e.g. structuring the first main surface 103 of the substrate 102 to define differently doped regions and/or layers. For example, the first main surface 103 may undergo a CMOS process.

Figure 1D:
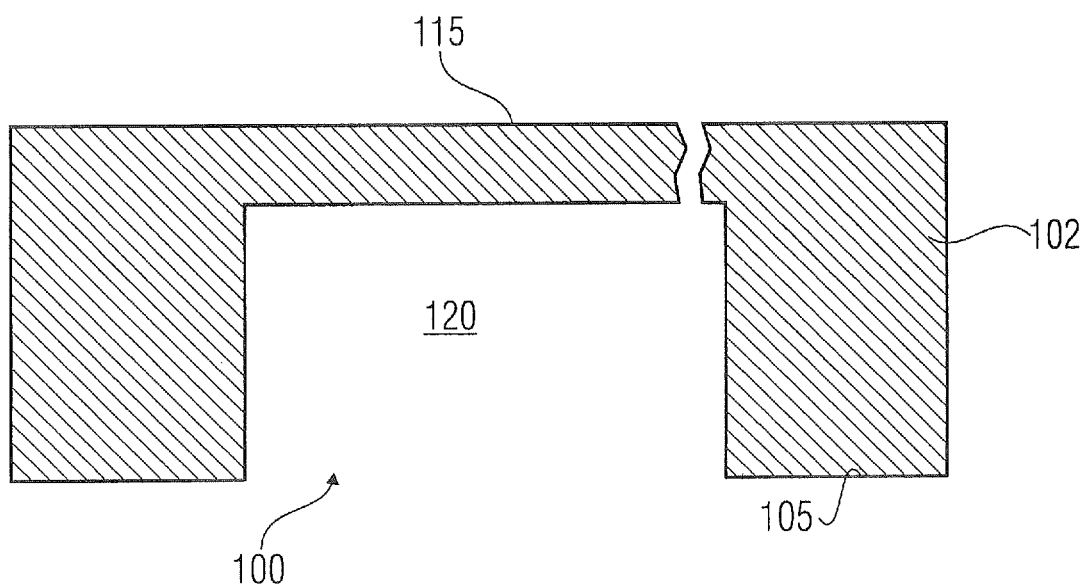

FIG. 1D shows the semiconductor structure 100 in a schematic manner after completion of the method of providing the semiconductor structure 100. The sacrificial structure 110 has been removed by etching away the walls or lamellae. This etching is performed from the side of the new second main surface 105 by means of e.g. a wet etching process. A large opening or recess 120 is thus obtained. The shape and the dimensions of the cavity 120 can be relatively precisely controlled by means of the shape and the dimensions of the sacrificial structure 110. The side walls of the cavity 120 can be formed to be substantially steep or orthogonal to the new second main surface 105, which may be a task difficult to accomplish with other cavity forming methods. Since the sacrificial structure comprises mostly thin walls or lamellae, offering a large surface for an etching agent, the process of etching away the sacrificial structure 110 hardly affects the sidewalls and/or the bottom of the cavity 120. In any event, an effect on the sidewalls and the bottom of the cavity 120 caused by the etching away of the sacrificial structure 110 can be predicted in a relatively exact manner, so that this effect may be taken into account when choosing the dimensions of the cavity 120 and/or the plurality of trenches 120.

The method illustrated and described in FIGS. 1A-1D offer good intergration capability and scalability of geometrical dimensions of the cavity 120. As an example, the cavity 120 may be used as a pressure channel for a pressure sensor. Providing a sufficiently large pressure channel from the gas or the liquid to the actual pressure sense element reduces the risk of the pressure channel becoming obstructed by e.g. small particles which may be present in the gas or the liquid. Accordingly, the sensor device is reliable with respect to a pressure measurement, even in polluted environments.

The method of providing a semiconductor structure 100 as illustrated in FIGS. 1A-1D does not require a lithography step from the second main surface 104 or other suitable methods for subsequently performing a local wet or dry chemical etching process. The step of etching away the sacrificial structure 110 is typically a KOH (potassium hydroxide) etching process from the new second main surface 105. The proposed method utilizes a DT etching from the first main surface 103 (front face) prior to the stage depicted in FIG. 1A.

The proposed method uses a DT etching process from the front-face, which concurrently creates the cavities for the pressure measurement and—matching thereto—sacrificial structures. The sacrificial structure(s) comprise(s) a region of silicon lamellae that are dissolved by a wet chemical etching step subsequent to a thinning of the wafer. The lamellae for the pressure chambers are etched less deep, the lamellae for the sacrificial structures are etched "as deep as possible"—this can be controlled via different widths of the trench openings. The different widths of the etched trenches enable a selective closure of the pressure chamber(s) without closing the lamellae of the sacrificial structures.

A photo technology from the back face can be dispensed with. Thus, for a pressure sensor, the benefits of a volume access from the back face are used without having to migrate to more complex and more expensive processes. The cavity for volume access and its dimensions can be shaped and chosen very freely.

The possibility of skipping a back-face lithography step makes the described method competitive in terms of production costs and complexity. The method provides an integration scheme of low complexity compared to existing solutions. Good agent compatibility may be achieved when the cavity 120 is exposed to certain liquids or gases, as the sidewalls and the bottom of the cavity 120 are typically of a single material. This also facilitates the sealing of the sidewalls and the bottom of the cavity 120 with a protective coating. Furthermore, when the structure is buried or open to the new second main surface 120, the semiconductor structure requires little space at the first main surface 103 of the substrate 102. If the layer formed by the cover material 115 is sufficiently thick, this layer may be used as a substrate for micro-electronical circuits such as CMOS circuits. In this manner, the provision of the cavity 120 requires only little additional surface area of the semiconductor structure, if at all. Finally, only approximately two additional mask layers are necessary for executing the proposed method if it is embedded in, and performed concurrently with, a larger semiconductor device manufacturing process.

In summary, the method illustrated in FIGS. 1A to 1D structures a region of a silicon lamellae by means of a DT etch, closes the region in a suitable manner, and removes the region of silicon lamellae at a later stage, in particular, subsequent to the thinning of a silicon wafer on which the semiconductor structure is to be formed. The removal of the region of silicon lamellae results in the opening of a wide trench. The dimension of the trench can be freely configured by means of the DT etch.

According to some aspects of the teachings disclosed herein it is proposed to integrate a pressure sensor element (or other MEMS components) as a buried structure on an ASIC chip. In the case of a pressure sensor the pressure information is supplied from the back face (or "second main surface"). Subsequent to the completion of the ASIC process the backface of the wafer is ground until a channel to the pressure cell opens up.

Besides the already mentioned integration suitability, the teachings disclosed herein offer good scalability of the geometric dimensions of the pressure channel, while maintaining the benefits of a vertical integration of the pressure cell. Hence the concept is apt for application areas in which an obstruction of narrow pressure channels due to exterior fluids would compromise the reliability of the pressure measurement.

Figure 2A:
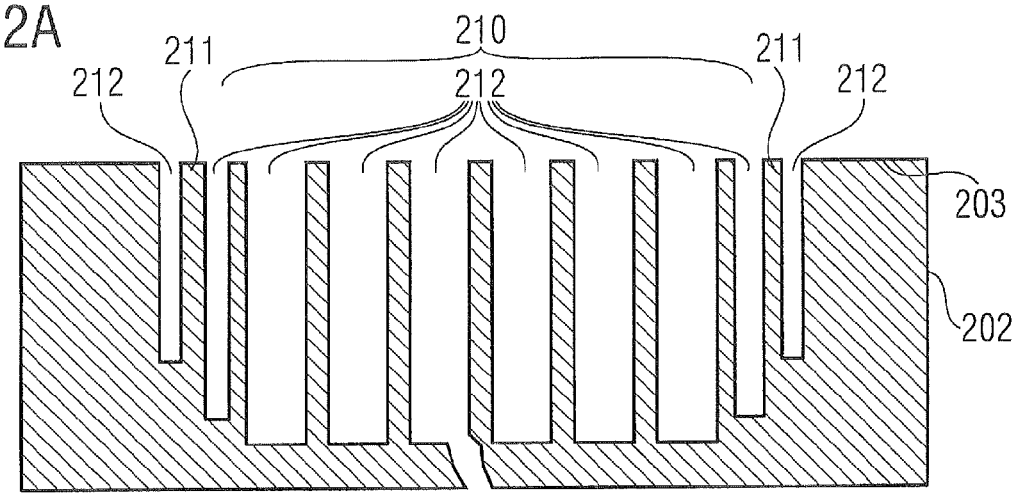
FIGS. 2A to 2F illustrate various stages of another embodiment of a manufacturing process of a semiconductor structure.
Figure 2B:
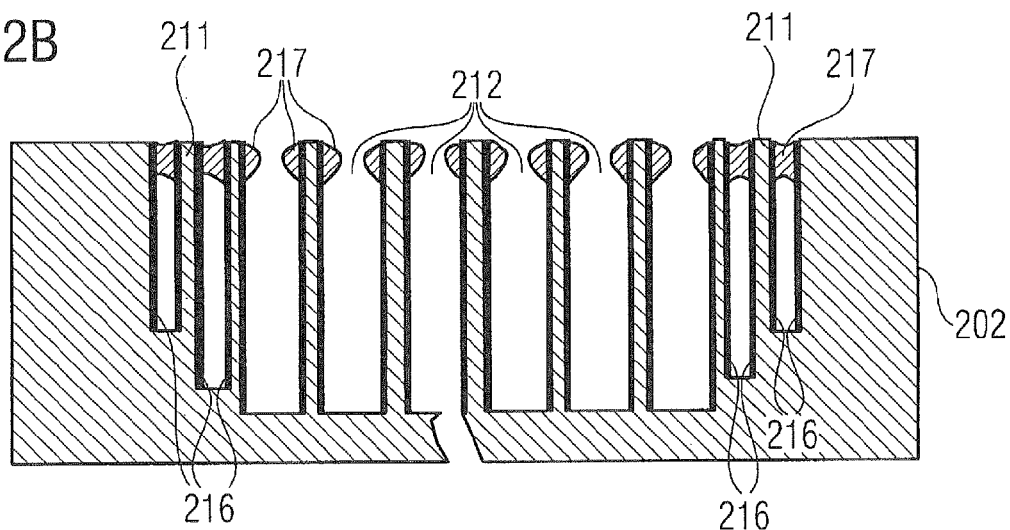

FIGS. 2A and 2B show six stages of an embodiment of a method for providing a semiconductor structure 200. FIG. 2A shows a semiconductor substrate 202 after the plurality of trenches 212 have been etched, starting at the first main surface 203 of the substrate 202. The plurality of trenches 212 comprises trenches of different trench widths. The outermost ones of the trenches 212 are relatively narrow, while the second trench and the next to the last trench (when counting from left to right) are moderately larger in width. Six trenches of the plurality of trenches 212 that are in the middle are relatively large in width. The different trench widths have an influence on the individual depth of the various trenches 212. The outermost trenches do not reach as far into the substrate 202 as the second trench and the next to the last trench. The six central trenches have the largest depth. The sacrificial structure 210 comprises most of the walls or lamellae that were formed when etching the plurality of trenches 212, except for the outermost walls or lamellae 211. As indicated in all sub-pictures of FIGS. 2A and 2B by the break line, the substrate 202 and the plurality of trenches 212 could be extended so that the sacrificial structure 210 may span a relatively large distance from left to right.

FIG. 2B illustrates the substrate 202 at an intermediate stage of the method for providing a semiconductor structure. Selective portions of the substrate 202 and possibly the side lamellae 211 have been doped in order to obtain arrangements of differently doped semiconductor regions within the substrate 202. For example, a pn junction may be formed in the side lamellae 211 in order to electrically insulate a portion of the side lamellae 211 from the rest of the substrate 202. A nitrite liner 216 has been applied to the sidewall of the plurality of trenches 212. Furthermore, a closing material 217 is deposited at the opening of the trenches 212. Due to the different widths of the plurality of trenches 212, the first trench, the second trench, the next to the rightmost trench, and the rightmost trench are closed earlier by the closing material 217 than the six central trenches. Thus, by timing the depositing process of the closing material 217 to the instant at which the four outer trenches are completely closed, but the six centre trenches are still open, a selective closing of at least one trench with smaller dimensions than the other trenches of the plurality of trenches can be achieved.

Figure 2C:
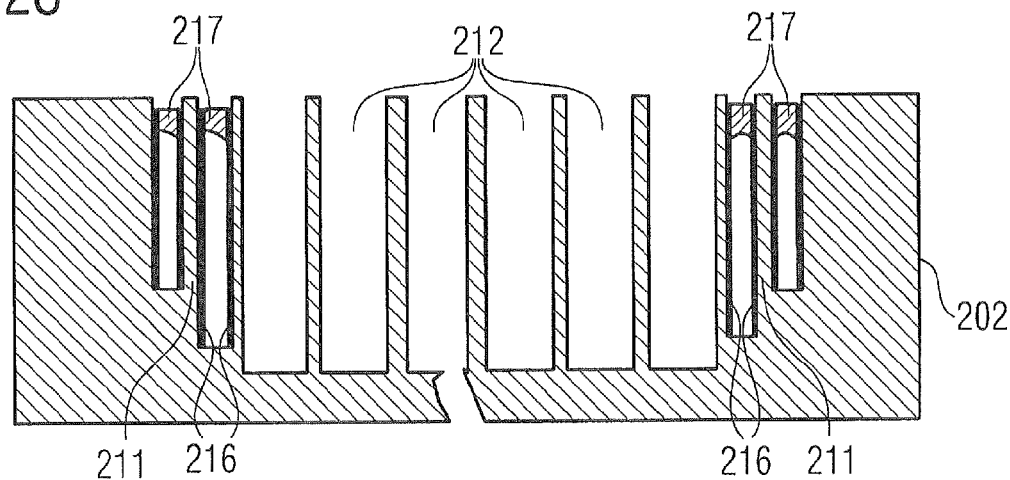

FIG. 2C shows a stage of the method after the liner 216 and the closing material 217 have been removed from the open trenches, i.e. the six center trenches having a larger width. As can be seen in FIG. 2C, a portion of the closing material 217 has also been removed from the more narrow trenches; however, the narrow trenches are still closed. The removing of the closing material 217 is configured and controlled such that the more narrow trenches stay closed. This results in the liner materials 216 in the narrow trenches being unaffected by the removing of the liner material due to the agent used to this end not being able to penetrate the narrow trenches.

Figure 2D:
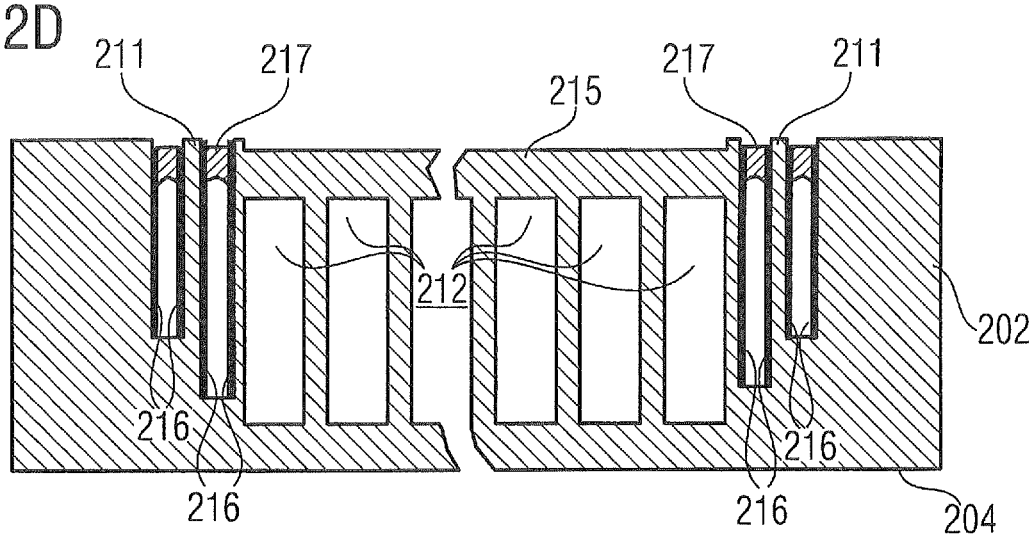

In FIG. 2D, the substrate 202 is illustrated after the cover material 215 has been applied to a part of the main surface 203 to cover the larger trenches of the plurality of trenches 202. An H-bake process may be used to this end.

The plurality of trenches 212 is now completely closed and thus forms a plurality of cavities within the substrate 202.

Figure 2E:
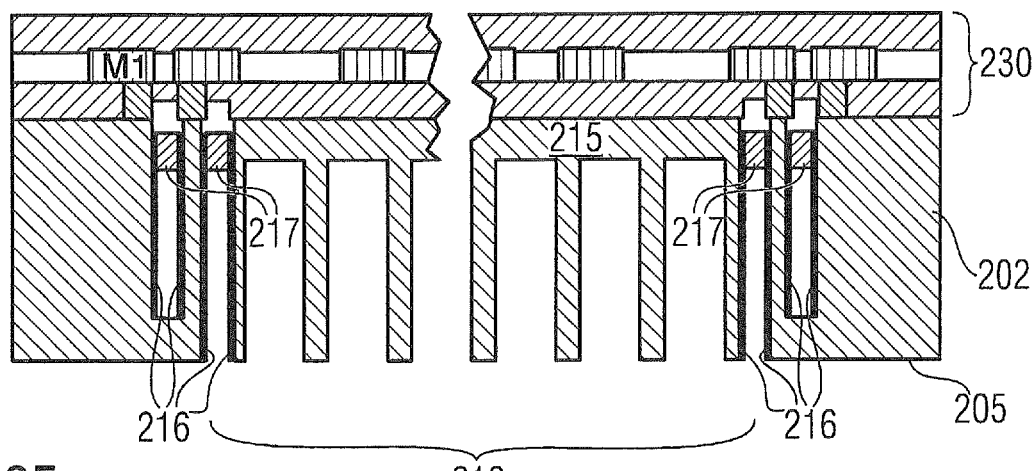

Between FIGS. 2D and 2E, the method of providing a semiconductor structure may perform a number of method steps that are typical for the production of semiconductor devices. Typically, a number of layers 230 are created on top of the first main surface 203. In an exemplary manner, three layers have been created, namely, an insulator layer, a metal layer, and e.g. a semiconductor layer. The insulator layer may be formed from silicon oxide, for example, while the additional layers 230 may form e.g. a CMOS circuit.

Another action occurring between stages depicted in FIGS. 2D and 2E is a back-end-of-line (BEOL) process and thinning the semiconductor substrate 202 from the second main surface 204 (FIG. 2D) to obtain a new second main surface 205 (FIG. 2E). The thinning removes the substrate material to a depth within the substrate at which a part of the plurality of trenches are present. These trenches 212 are therefore opened as a result of the thinning process. The leftmost trench and the rightmost trench have a smaller depth than the other trenches and are therefore not opened during the thinning process. The leftmost trench and the rightmost trench remain as closed cavities or "buried" cavities. Note that it is not necessary for both the leftmost cavity and the rightmost cavity to be present. The teachings disclosed herein are also valid in case only one cavity of the leftmost cavity and the rightmost cavity is provided by the method.

Figure 2F:
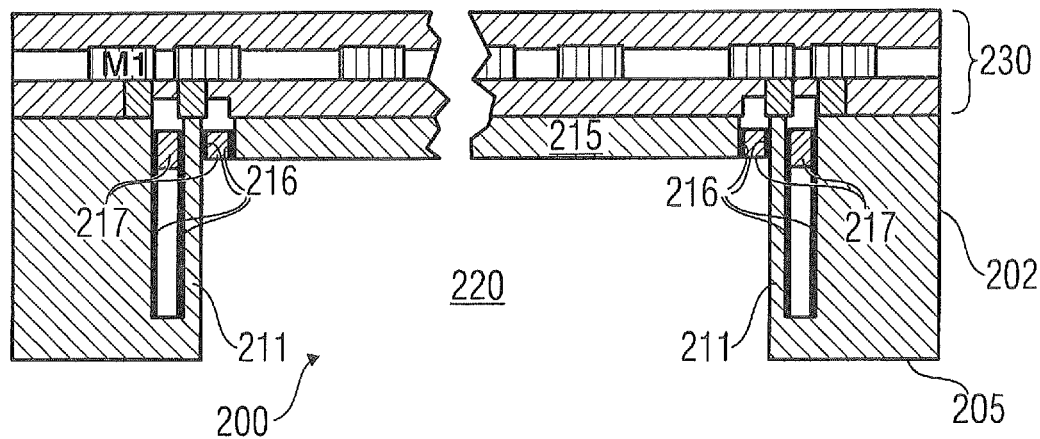

In FIG. 2F, the resulting semiconductor structure 200 is shown. The sacrificial structure 210 has been removed, as well as any liner material present in those trenches that have been opened to the new second main surface 205 during the thinning process. The removal of the sacrificial structure 210 results in the formation of a cavity or recess 220. This cavity or recess 220 may be used for a number of purposes. Examples are the pressure channel in the pressure sensor mentioned above, a receptacle for e.g. a small rod to measure mechanical forces, a cavity required in a power electronics or high voltage component, etc.

The leftmost and the rightmost trenches are still present in the form of cavities that are separated from the large cavity or recess 220 by means of sidewalls or lamellae 211. In an exemplary configuration of the semiconductor structure as a pressure sensor, the cavities formed by the leftmost and the rightmost trenches provide pressure chambers. When the pressure in the main cavity 220 varies, the sidewall 211 is accordingly deflected. This leads to a variation of a width of the leftmost and rightmost trenches. Either the deflection of the sidewall 212 or the variation of the trench width can be measured by means of suitable transducing elements provided, for example, within the additional layers 230.

The liner material 216 serves as a barrier to the etching process by which the sacrificial structure 210 was removed. Thus, the liner material present in the second trench and the next to the last trench act as a protection for the sidewalls 211 with respect to the etching process performed from the second main surface. Thus, the shape of the sidewalls that was obtained during the DT etching performed from the first main surface 203 prior to FIG. 2A can be substantially preserved. The sidewalls 211 can therefore be created with relatively high precision.

As can be seen in FIG. 2F, the bottom of the cavity 220 is composed mainly of the cover material 215. In the corners of the cavity residues of the closing material 217 and the liner material 216 used to selectively close the former second trench and the former next to the last trench are still present.

This may be exploited as e.g. an electrical installation of the cover material 215 of the bottom of the cavity 220 against other parts of the substrate 202.

The process according to FIGS. 2A to 2F solves the problem that etching the silicon between FIGS. 2E and 2F would also etch away a lamella at the border of the large cavity 220, if this lamella is directly exposed to the etching agent. For this reason an additional sacrificial lamella is provided, which protects the lamella to be used as a pressure sensitive membrane from being affected by the etching agent. This process requires, in an ideal case, only one mask layer for shaping the pressure sensor element. It thus offers a cheap option for designing the back face volume access with respect to its dimensions in a manner that it cannot be easily obstructed by particles or liquids.

Figure 3A:
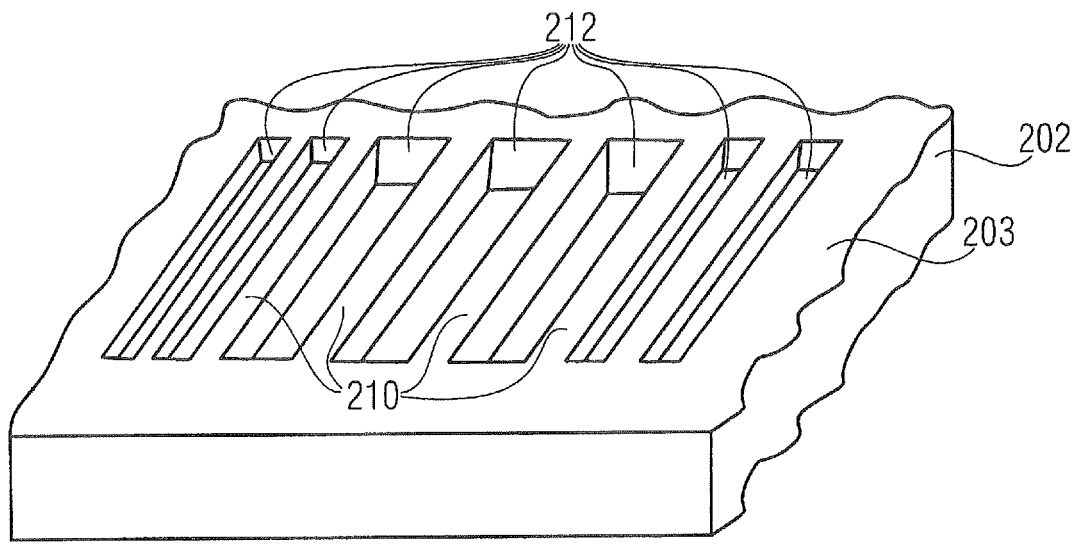
FIG. 3A illustrates a partial perspective top view of a semiconductor structure during a stage of a manufacturing process at which a plurality of trenches have been etched at a first main surface.

FIG. 3A shows a perspective view of the semiconductor substrate 202 and its first main surface 203. FIG. 3A corresponds, by and large, to FIG. 2A with the exception that, for the sake of clarity and illustration, only seven trenches are illustrated in FIG. 3A, instead of ten trenches. Note that FIG. 3A is a schematic representation only, and not to scale.

Figure 3B:
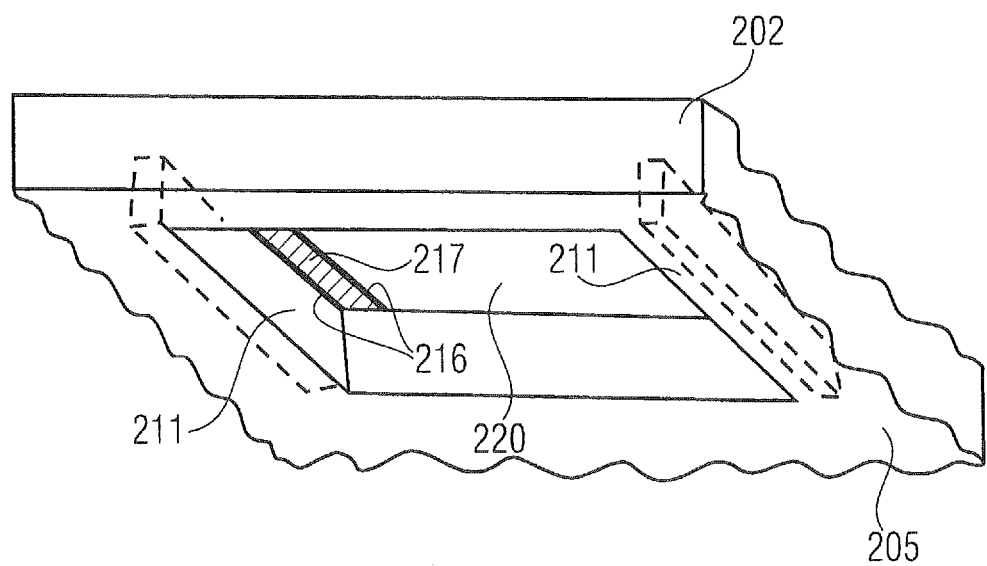
FIG. 3B illustrates a partial perspective bottom view of a semiconductor structure during a stage of a manufacturing process at which a sacrificial structure has been removed.

FIG. 3B shows a perspective view of the semiconductor substrate corresponding to FIG. 2F. The perspective view shows the new second main surface 205 and the cavity 220. The closed cavities to the left and to the right of the large cavity 220 are drawn as a dashed line. As explained above, the closed cavities are separated from the large cavity 220 by means of the sidewalls 211. At the bottom of the large cavity 220, a strip can be observed which comprises the closing material 217 and the liner material 216.

The method for providing a semiconductor structure as illustrated and explained in FIG. 1, as well as the semiconductor structure 100, 200 itself, may be enhanced by some of the aspect explained in the context of the description of FIGS. 2A and 2B, and also by some of the following aspects.

The plurality of trenches 112, 212 may comprise at least one trench with smaller dimension than other trenches of the plurality of trenches.

The method may further comprise selectively closing the at least one trench with smaller dimension at the first main surface 103, 203 subsequent to the forming of the sacrificial structure 110, 210.

The selective closing may be prior to the step of covering the plurality of trenches 112, 212 and the method may further comprise: depositing a liner material 216 within the plurality of trenches 112, 212 prior to the selective closing of the at least one trench with smaller dimension; performing the selective closing of the at least one trench with smaller dimension; and removing the liner material 216 from the other trenches. During the etching from the second main surface 104, sacrificial structures 110, 210 adjacent to trenches, in which the liner material 216 has been removed, may be etched away and structures bounded by trenches, in which the liner material has been kept, may be kept.

The method may further comprise: etching a further trench adjacent to the field of sacrificial structures 110, 210 concurrently with the etching of the plurality of trenches 112, 212. The further trench and the at least one cavity 120, 220 may form a wall 211 between them subsequent to the etching-away of the sacrificial structure 110, 210.

Figure 14:
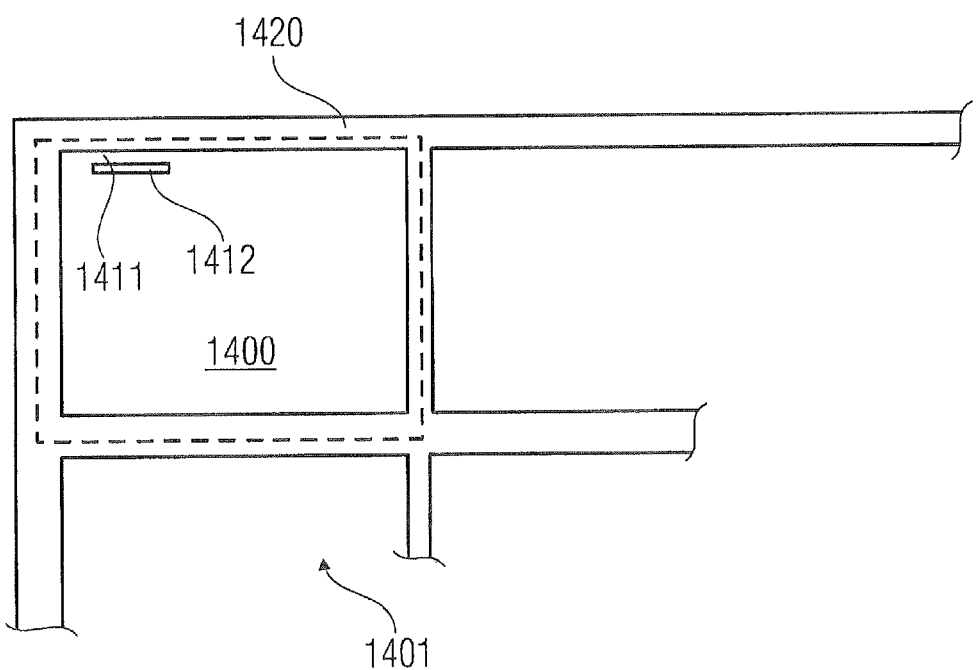
FIG. 14 shows a part of a semiconductor wafer comprising several semiconductor structures prior to a singulation process for obtaining single semiconductor structures.

Referencing FIG. 14, the method may further comprise: etching a chip singulation trench 1420 into the substrate 102, 202 to define a lamella 211 between the chip singulation trench 1420 and a cavity 120, 220, 1400 that is formed by the etching away of the sacrificial structures 110, 210 from the second main surface 104, 204; and singulating the semiconductor structure at the chip singulation trench 1420.

Figure 4B:
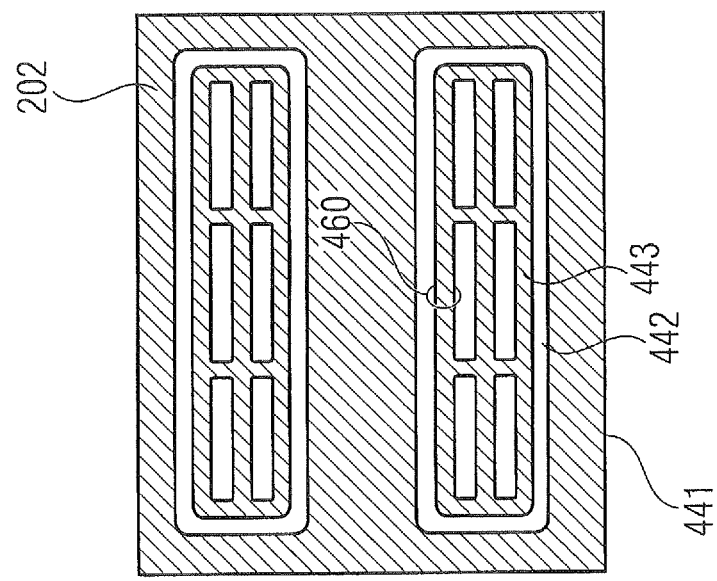
FIGS. 4A and 4B illustrate cross sections through cavities and two variants of inner structures within the cavities.
Figure 4A:
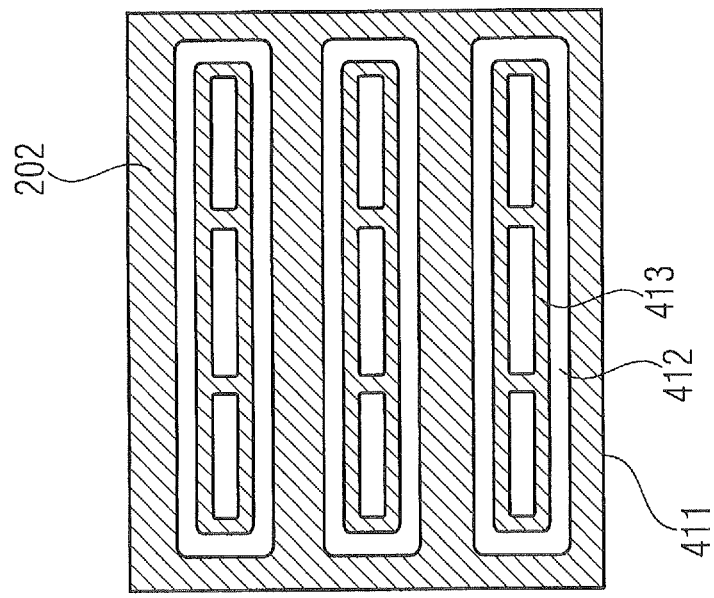

Also referencing FIGS. 4A and 4B, a cavity 120, 220, 412, 442, 1112, 1400 that is formed by the etching away of the sacrificial structures from the second main surface 104, 204 may have a tapered cross-section.

The method may further comprise: forming a circumferential trench 413, 443 surrounding an inner structure 413, 443 adjacent to a region of the plurality of trenches 112, 212; and covering the circumferential trench with a cover material.

The method may further comprise, prior to the forming of the sacrificial structure: creating an electrically insulating layer on the first main surface of the substrate; and depositing an outer layer of substrate material on the electrically insulating layer. The etching of the plurality of trenches may be done from a surface of the outer layer and may extend to the electrically insulating layer, at least.

When focusing on the sensor structures, a method of providing a sensor structure for transducing a mechanical quantity to an electrical quantity may comprise:

forming a sacrificial structure 110, 210 by etching a plurality of trenches 112, 212 from the first main surface 102, 202 of the sensor structure;

covering the plurality of trenches at the first main surface 102, 202 with a cover material 115, 215 to define cavities within the sensor structure;

removing a part of the sensor structure from a second main surface 104, 204 opposite to the first main surface 102, 202 to a depth at which (at least some of) the plurality of trenches 112, 212 are present;

etching away the sacrificial structure 110, 210 from the second main surface 104, 204 of the sensor structure; and providing a transducing element for transducing the mechanical quantity to the electrical quantity at a wall 211 of a cavity 120, 220, 1400 formed by etching away the sacrificial structure 110, 210.

Typically, the sensor structure is, or comprises, some sort of semiconductor substrate. The provision of the transducing element at the wall of the cavity means that the transducing element is arranged to detect and possibly quantify effects on the wall caused by the mechanical quantity. As such, the expression "at a wall of a cavity" relates primarily to a functional relation between the transducing element and the walls, not necessarily a spatial relation.

The etching of the plurality of trenches 112, 212 may comprise structuring the sensor structure with an arrangement of sacrificial structures 110, 210, the arrangement defining a dimension of the cavity 120, 220, 1400.

The covering of the plurality of trenches 112, 212 may comprise at least one of an epitaxy process and a Venetia process.

The method may further comprise creating semiconductor structures on the first main surface subsequent to the covering of the plurality of trenches 112, 212.

The plurality of trenches may comprise at least one trench with a smaller dimension than other trenches of the plurality of trenches 112, 212, and the method may further comprise: selectively closing the at least one trench with the smaller dimension at the first main surface subsequent to the forming of the sacrificial structure 110, 210.

The selective closing may be prior to the step of covering the plurality of trenches 112, 212, the method may further comprise, prior to the step of covering: depositing a liner material 216 within the plurality of trenches 112, 212 prior to the selective closing of the at least one trench with the smaller dimension; removing the liner material 216 from the other trenches; wherein, during the etching from the second main surface, sacrificial structures 110, 210 adjacent to the other trenches, in which the liner material 216 has been removed, may be etched away and structures bounded by the trenches, in which the liner material 216 has been kept, may be kept (i.e. are not etched away).

The method may further comprise: etching a further trench adjacent to the field of sacrificial structures; wherein the wall 211 comprising the transducing element may be formed between the further trench and the at least one cavity subsequent to the etching of the sacrificial structure.

A micro-electromechanical sensor structure may be obtained by a method according to one or more of the aspects according to the teachings disclosed herein. The micro-electromechanical sensor structure may be adapted for transducing a mechanical quantity to an electrical quantity and comprise:

a substrate 102, 202 having a main surface 103, 203;

a first cavity 120, 220, 1400 formed in the substrate 102, 202; and a second cavity formed in the substrate approximate to the first cavity and separated by a lamella 211, 1311, 1411 from the first cavity.

The first cavity may have a first cavity dimension and the second cavity may have a second cavity dimension. The first cavity dimension and the second cavity dimension may extend in a direction parallel to the main surface and a ratio between the first cavity dimension and the second cavity dimension may be equal to or greater than ten.

The first cavity may have a width between 1 μm to 1 mm and the second cavity has may have a width between 10 nm to 800 nm, in order to give an exemplary understanding of the order of dimension.

The first cavity may be a pressure inlet and the second cavity may be a closed pressure reference volume.

The first cavity may be open to the main surface of the substrate and may have an opening angle comprised in the range from 60 degrees to 110 degrees (e.g. 70 degrees, 80 degrees, 85 degrees, 90 degrees, 95 degrees, 100 degrees, as well as values between these selected values).

The second cavity may be lined with a liner material 216.

With respect to a semiconductor structure, it may comprise a semiconductor substrate and a cavity within the semiconductor substrate which is bounded by a bottom and a sidewall. The bottom may comprise a section adjacent to a transition between the bottom and the sidewall. The section may comprise a film material different from the substrate material of the semiconductor substrate.

For a difference between the film material and the substrate material to be present, it may be sufficient that the second is distinguishable from the remainder of the bottom, even though the same material is similar in a chemical sense. For example, the section could have a different crystal structure or crystal orientation than the bottom of the cavity. The transition between the bottom and the sidewall may be a corner. The section with the different material is typically a residue of one of the plurality of trenches 312 or 212 that may be exploited to fulfill some functions in the finished semiconductor structure, such as an electrical installation.

The present document also teaches a method for fabricating a semiconductor structure, the method comprising: creating an electrically insulating layer at a first main surface of a semiconductor substrate; providing semiconductor material on the electrically insulating layer; etching a first opening into the provided semiconductor material and the semiconductor substrate; and etching a second opening into the provided semiconductor material and the semiconductor substrate to define a lamella between the first opening and the second opening. The method may further comprise: fabricating a sense element for sensing a deflection on the lamella. The two etching actions may be performed during a single step of the process. The semiconductor substrate may be doped with a first doping type. The creation of the electrically insulating layer may then comprise a doping of the first main surface of the semiconductor substrate with a second doping type. Another option is to inject e.g. oxygen atoms at the first main surface of the semiconductor substrate and to perform an annealing step to create a layer of oxide at the first main surface of the semiconductor substrate. The provision of the supplementary semiconductor material may be achieved by an epitaxy process or a Venezia-process. The technical features of this method may be combined with one or more of the other methods disclosed in this document.

A corresponding semiconductor structure comprises: a semiconductor substrate comprising a base substrate, a deposited or supplementary (top) layer, and an electrically insulating layer between the base substrate and the deposited (or supplementary) layer; a first cavity within the deposited (or supplementary) layer, the electrically insulating layer, and the base substrate; and a second cavity within the deposited (or supplementary) layer, the second cavity being open to an atmosphere and defining a first lamella between the first cavity and the second cavity, the first lamella intersecting the electrically insulating layer. The semiconductor may also comprise a sense element configured for sensing a deflection on the first lamella. The base substrate and the deposited (supplementary) layer may be of a first doping type and the electrically insulating layer may be of a second doping type, the second doping type being opposite in polarity to the first doping type. As in the context of the method, the electrically insulating layer may have been obtained by means of an annealing process. The technical features of the semiconductor structure just described may be combined with features of other embodiments of a semiconductor structure disclosed herein.

FIGS. 4A and 4B illustrate cross-sections through cavities where the section plane is substantially parallel to the main surfaces 103, 104, 203, 204 of the substrate 102, 202. Referring to FIG. 4A, the substrate 202 comprises three similar cavities or trenches 412. The cavities 412 are in the form of circumferential cavities surrounding an inner structure 413. The inner structure 413 may be connected to the substrate 202 at a place above and/or beneath the drawing plane. Sidewalls of the inner structure 413 which are represented by means of their cross-sections in FIGS. 4A and 4B are typically not in contact with the sidewalls of the cavity 412, as can be seen in FIGS. 4A and 4B. Therefore, the inner structure 413 may be regarded as substantially free standing within the cavity 412. For the purposes of this disclosure, the expression "free standing" may comprise an inner structure 413 that is connected to the substrate 202 at two of its extremities, typically the top and the bottom extremities. The expression "free standing" also encompasses inner structures 413 that are connected to the substrate 202 at a single extremity, regardless of a spatial relation of the connection between the inner structure 413 and the substrate 202 (of top, bottom, or side).

FIG. 4B resembles FIG. 4A, but the cavity 442 is larger. Also the inner structure 434 is larger and has a different configuration.

In both, FIGS. 4A and 4B the inner structures 413, 443 are configured as tubes having reinforcement members to improve the stability of the inner structures 413, 443. Especially when the inner structures 413, 443 are connected at a single one of its extremities to the substrate 202, a sufficient stability of the inner structure 413, 443 is required. The configuration as a tube with reinforcement members or reinforcement walls is capable of providing the required level of stability.

The inner structures 413, 443 may be used as one of the electrodes of e.g. a capacitor. Referring to FIG. 4A, the lower cavity 412 of the three illustrated cavities may be adjacent to a sidewall or a lamella 411. The lamella 411 may deflect as a function of a pressure difference between the cavity 412 and a volume on the other side of the lamella 411. As a consequence, the gap between the lamella 411 and the inner structure 413 changes its width leading to a variation in the capacitance of a capacitor formed by the lamella 411 and the inner structure 413. As the inner structure 413 is relatively stable and/or rigid, neither the pressure difference nor the deflection of the lamella 411 causes the inner structure 413 to move in a significant manner. When the inner structure 413, 443 is used as an electrode of a capacitor or the like, it is typically necessary to provide an electrical connection means 460 (represented schematically as the location where the electrical connection is situated) between the inner structures 413, 443 and some sort of evaluation circuitry. The lamella 411, 441 is typically close to a large cavity 220, or even an edge of a semiconductor chip. The substrate 202 is relatively delicate in the vicinity of the large cavity or the chip edge; i.e., the substrate may have reduced rigidity in this region. Therefore, it may be advantageous to position the electrical connection means 460 at some distance from the lamella 411, 441. Especially with the inner structure 434 shown in FIG. 4B, the electrical connection means 460 can be provided sufficiently far away from the lamella 441, as the inner structure 443 is relatively large. For example, the electrical connection means may be provided at the position indicated by the circle in FIG. 4B.

Figure 5:
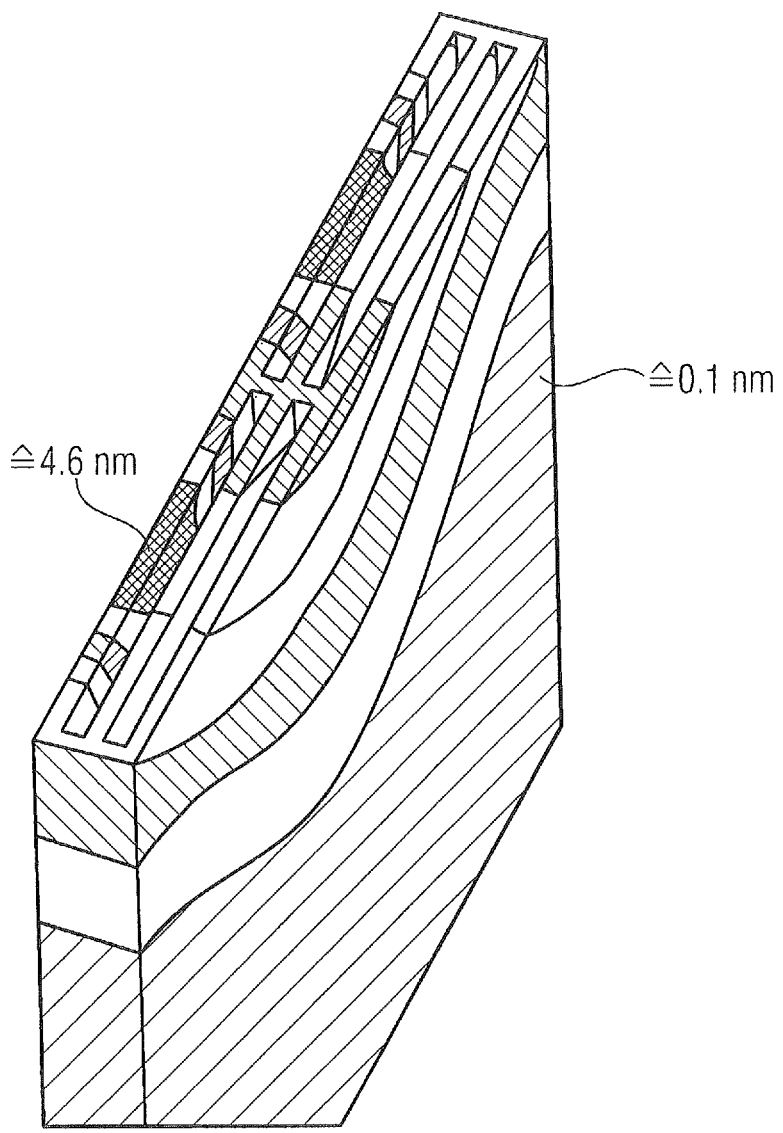
FIG. 5 illustrates a perspective view of a variant of an inner structure.

FIG. 5 shows a perspective view of an embodiment of an inner structure 543 similar to the inner structure 443 shown in FIG. 4B. As an alternative to the above mentioned utilization as a relatively rigid structure, the inner structure 543 shown in FIG. 5 could also be configured to provide the deflecting portion(s) at the sidewalls of the inner structure 543. To illustrate this, FIG. 5 shows by how much various portions of the inner structure deflect upon solicitation with a pressure (or pressure difference) of 1 bar. FIG. 5 shows the result of a finite element model (FEM) simulation. The minimum deflection calculated by the FEM simulation is 0.1 nm (indicated by a wide hatching in the drawing), the maximum deflection is 4.6 nm (indicated by a cross hatching). Intermediate levels of deflection are indicated, usually in an alternating manner, by non-hatched areas or different narrowly hatched areas. In these areas deflection values can be observed depending on their distance to the minimum deflection area(s) and the maximum deflection area(s). The inner structures shown in FIGS. 4A, 4B, and 5 are configured such that they provide a sufficient process capability via a sufficient rigidity. During an operation at a later time a sufficiently large deflection occurs at the long sections of the lamellae, as can be seen at the section illustrated in cross hatch, where a deflection of 4.6 nm has been predicted by the FEM simulation. A sufficiently large deflection ensures a desired level of sensitivity. Note that the inner structure 543 is not necessarily open at its upper end, as it is illustrated in FIG. 5. It is equally possible that the inner structure 543 is closed at its upper end so that four closed cavities (or any other number of closed cavities) are formed. The closed cavity may then assume the role of a pressure reference volume, while the pressure to be measured is applied from the circumferential trench surrounding the inner structure 543. It is also possible that the circumferential trench represents the reference volume and is therefore closed by a cover material. The pressure to be measured is the applied to the four or more cavities acting as pressure channels.

Figures 6A, 6B:
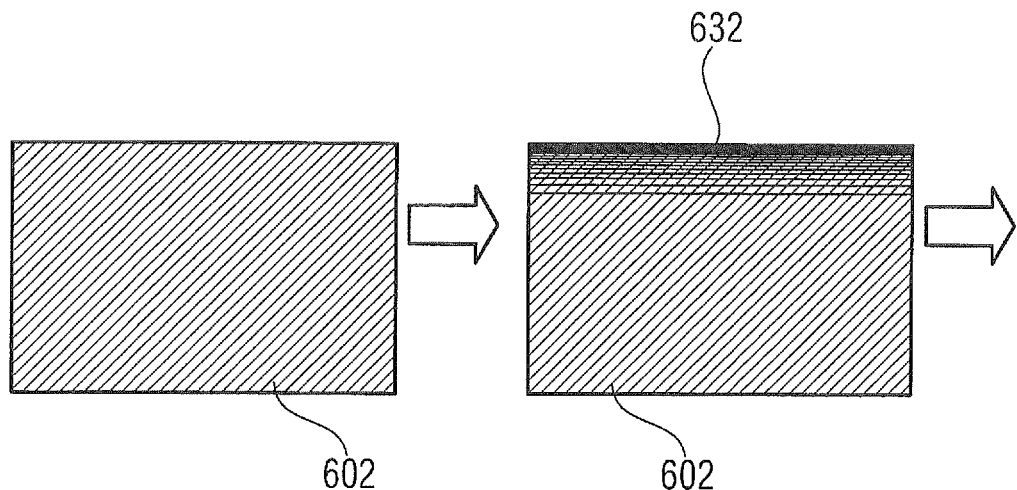
FIGS. 6A to 6D illustrate various stages of a depositing process and a subsequent etching of a semiconductor substrate.
Figures 6C, 6D:
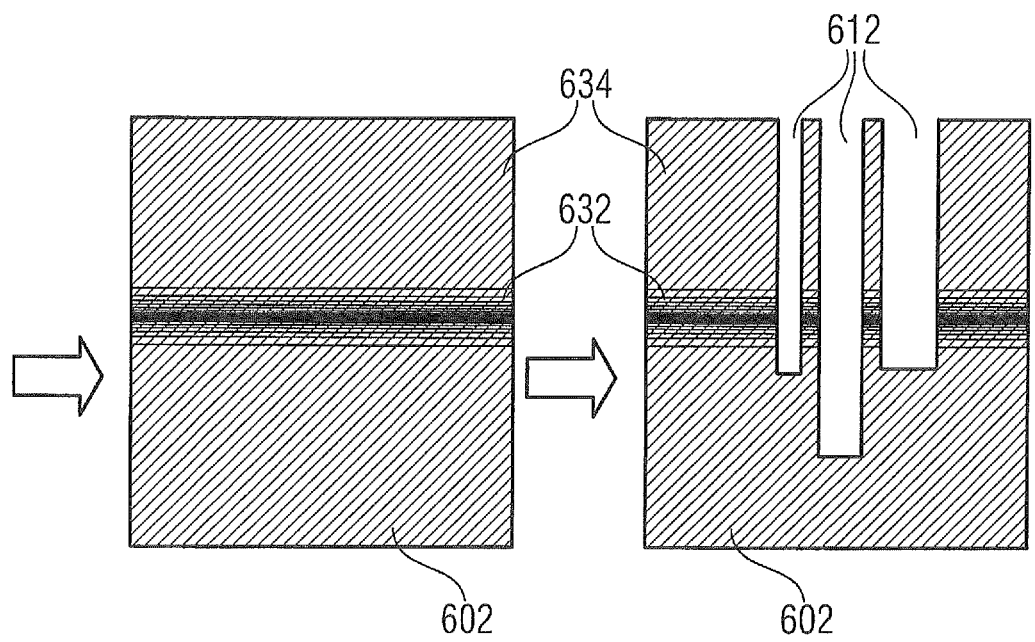

FIGS. 6A to 6D show four stages of a process by which an electrically insulating layer can be provided in a semiconductor substrate 602. The substrate 602 is typically a semiconductor material with a basic doping of a first polarity, e.g. n⁻ or p⁻. In a first step, the substrate 602 is doped with an opposite polarity at a surface to create an oppsingly doped layer 632. Subsequently, an epitaxy is performed to build up a layer 634 on top of the oppsingly doped layer 632. FIG. 6D shows how a plurality of trenches 612 has been etched into the layer 634, the oppsingly doped layer 632, and the (original) substrate 602. At the oppsingly doped layer 632 two pn junctions will be formed, one of which is typically in reverse mode when a voltage is applied between for example, the upper and lower main surfaces of the substrate 602. Due to one of the two pn junctions being in reverse mode, the oppsingly doped layer 632 acts as an insulator. On the other hand, the substrate 602 comprises, in one embodiment, a homogeneous material. The oppsingly doped layer 632 may have different electrical properties compared to the rest of the substrate 602, but its chemical properties are substantially identical. Therefore, the plurality of trenches 612 can be etched through all three layers 634, 632, and 602 in substantially the same manner, for example, by means of a DT etching process.

The process illustrated in FIGS. 6A to 6D may be performed prior to the methods illustrated in FIGS. 1, 2A, and 2B. The process shown in FIGS. 6A to 6D may also be combined with the arrangement of circumferential cavities and inner structures shown in FIGS. 4A, 4B, and 5. Referring to FIG. 6D, it can be seen that the thin walls comprise portions that are electrically insulated from the lower part of the substrate 602 by means of the oppsingly doped layers 632. Especially when the trenches are formed as circumferential trenches, as shown in FIG. 4A, the inner structure is completely electrically insulated from the lower part of the substrate 602 exclusively by the oppsingly doped layer 632. Hence, no additional measures need to be undertaken in order to achieve an electrical insulation of the inner structure 413 (FIG. 4A).

Figure 8:
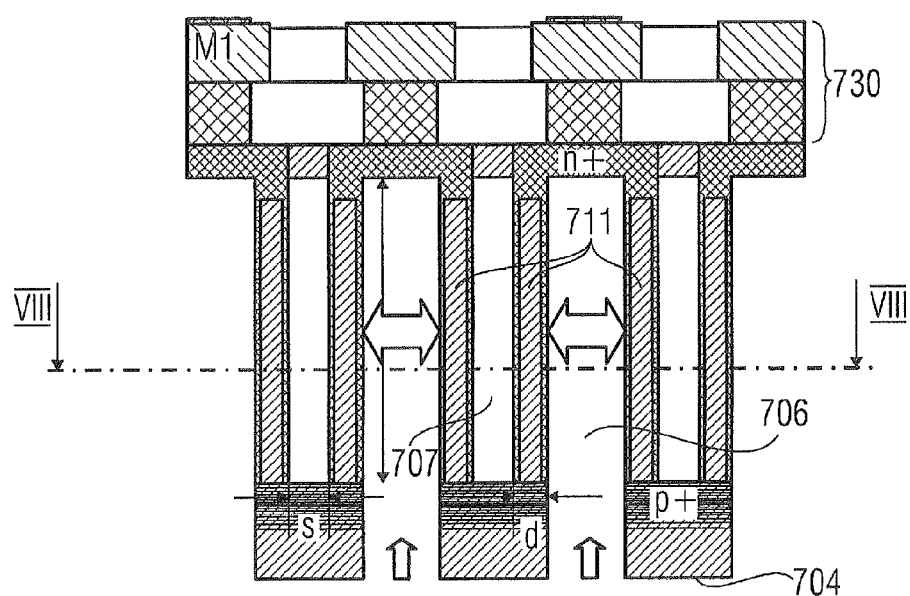
FIG. 8 illustrates a sensor structure implemented using a semiconductor structure.

Pressure sensors with a vertical configuration formed in a semiconductor substrate (as depicted in FIG. 8 and explained below) have been developed by the inventors in the past. With some of these pressure sensors, it poses a challenge to apply a doping in trenches having extreme aspect ratios, the doping providing for an electrical insulation of the pressure sensitive lamellae. Furthermore, a lateral doping of opposite polarity needs to be provided at the ends of the trenches. If possible, the process sequence employed to this end should be mask-free and robust.

Figure 7A:
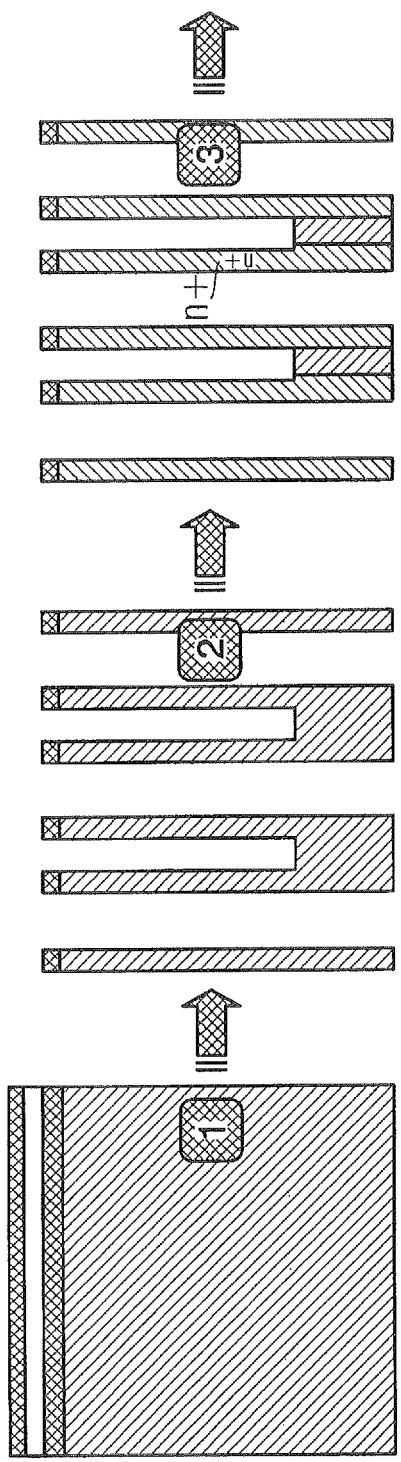
FIGS. 7A to 7F illustrate a process sequence for electrically insulating pressure sensitive structures as currently used by the employer of the inventors.
Figure 7B:
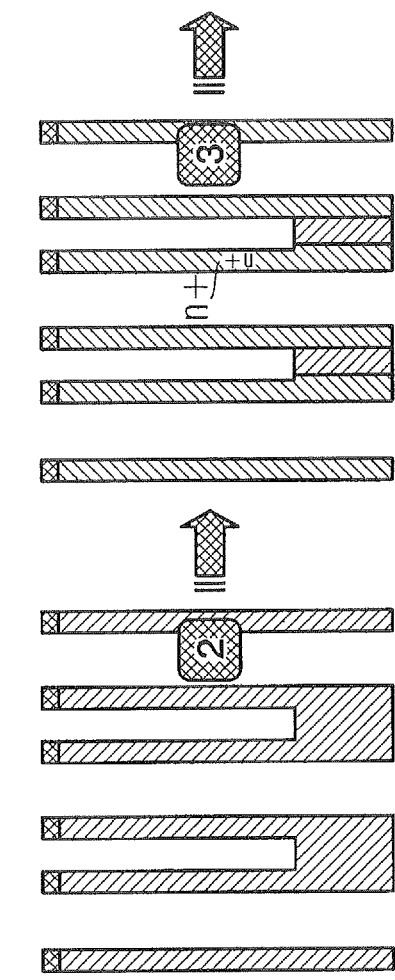
Figure 7C:
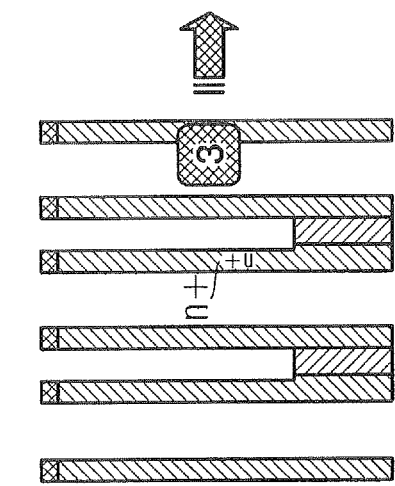
Figure 7D:
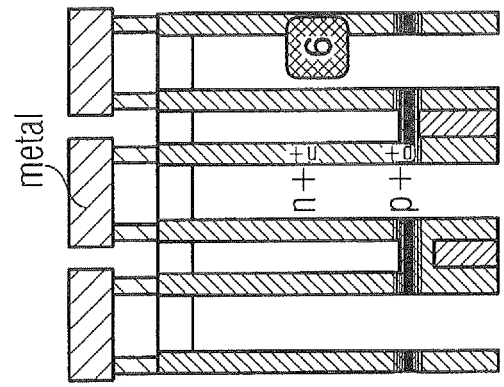
Figure 7E:
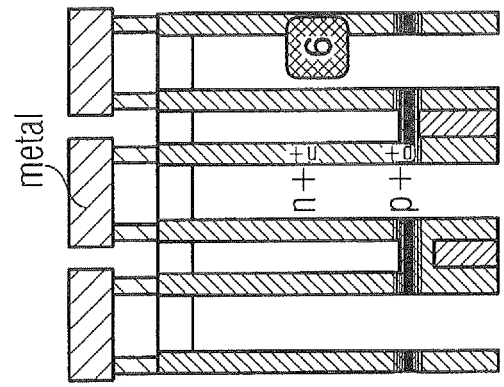
Figure 7F:
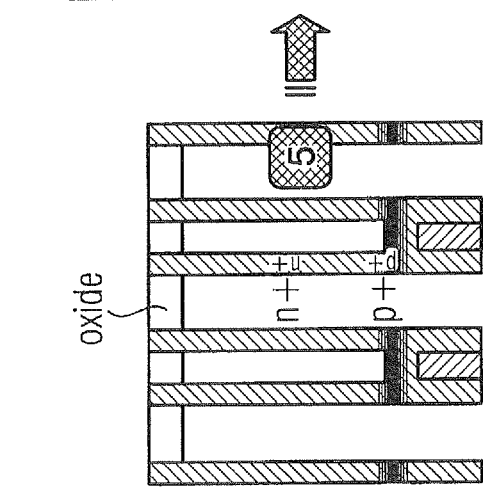

Up to now, proposals have been made within the company employing the inventors to realize the lamella doping by means of an arsenic glass coating and, subsequently, to provide the electrical insulation of the lamellae at the bottom and the sides by means of two angled boron implantations. A currently used process sequence for electrically insulating the pressure sensitive structures is illustrated in FIGS. 7A to 7F and comprises the following steps:

depositing the hard mask heap for trench etching (FIG. 7A)

trench etching and hard mask heap removal (nitride layer stays at the surface and blocks the future arsenic glass coating and the boron implantation at the affected locations) (FIG. 7B)

arsenic glass coating and driving in of the arsenic (FIG. 7C)

boron implantation and activation of the boron (FIG. 7D)

depositing oxynitride (thin pad oxide beneath), recess of oxynitride (the superficial nitride is removed at the same time) (FIG. 7E)

metallization (FIG. 7F)

In FIG. 7D a boron implantation at an angle of 45 degrees with respect to the drawing plane and a second boron implantation rotated by 180 degrees are shot in order to concurrently ensure the doping of opposite polarity for the bottom (layer at the height indicated by "p+") and at the trench end. Typical accuracies of adjustment within implantation equipment are around 1 degree. Depending on the aspect ratio of the trench higher accuracies are required so that, for example, implantation was performed several times in order to make a hit. This may result in a relatively large variance of the implanted dose. Even though multiple implantations were performed, it is challenging to achieve a sufficiently high doping of opposing polarity in order to isolate the lamellae.

According to teachings disclosed herein, a combination of structural modifications and a modified scheme of integration, or a new doping sequence for electrically insulating the structure, is proposed. First, the pressure sensitive structures are adapted in a manner that an insulation at the lamella end may be omitted, the result of which can be seen if FIGS. 4A, 4B, and 5, for example. An angled implantation for doping the lamella ends is not required anymore. It is sufficient to dope the inner structure(s) at the bottom of the trench for completely insulating the pressure lamellae from the substrate. This introduces new integrating options. A simple variant is an epitaxy of the substrate in a manner that the doping of opposing polarity on the wafer may be manufactured even before the etching of the trenches. The sequence is sketched in FIGS. 6A to 6D.

The implanted dose can be controlled relatively precisely and a sufficiently high doping can be achieved with a few implantations, or even a single implantation.

The teachings disclosed herein may be combined with, or realized by, a silicon on insulator (SOI) technology. This technology refers to the use of a layered silicon-insulator-silicon substrate in place of conventional silicon substrates in semiconductor manufacturing, especially microelectronics, to reduce parasitic device capacitance and thereby improving performance. The insulator is typically silicon dioxide or sometime sapphire. Instead of the doping performed e.g. prior to FIG. 6B, the insulator layer of a SOI structure may be applied or created by processes known in the field of SOI technology.

A non-angled implantation into the bottom of the trench is also conceivable. This typically results in a simpler process compared to the angled implantation. Depending on the depth of the structures an ultrahigh energy implantation is also possible—with a high temperature annealing step, which disperses the doping elements sufficiently and activates them (e.g., 3 MeV phosphor and 240 minutes at 1200 degrees Celsius). Latter combination would be slightly cheaper than a sequence with an epitaxy step as proposed above.

FIG. 8 illustrates a cross-section through a semiconductor structure used as a pressure sensor. The cavity 706 is a pressure channel and the cavity 707 is a pressure chamber serving as a reference for the pressure measurement. A lamella 711 is provided between the pressure channel 706 and the pressure camber 707. The two lamellae 711 enclosing the pressure chamber 707 are capable of deflecting under the influence of a pressure difference between the pressure channel 706 and the pressure chamber 707. The left lamella forms a first electrode of a capacitor, the right lamella 711 forms a second electrode of the capacitor, and the pressure chamber 707 forms the gap of the capacitor. In order to be electrically conductive, each one of the two lamellae 711 acting as a capacitor electrode is n+ doped, at least at the surface of the lamella. The two electrodes are electrically connected to an evaluation circuitry provided in one or more layers 730. The structure shown in FIG. 8 also has a second main surface 704 to which the pressure channels 706 are open. The width of the gap of the capacitor is indicated by the letter s, while the width of the lamella 711 is indicated by the letter w in FIG. 8. In order to electrically insulate the lamellae 711 with respect to each other at their lower ends, the p+ doped section is provided, which acts as an insulating layer in a manner similar to the one described with regard to FIGS. 6A to 6D.

The construction of pressure sensors (either standalone or integrated into an ASIC) is typically quite similar among currently available models: a cavity is limited unilaterally or multilaterally by a lamella. The lamella is exposed to external media so that it deflects upon an external pressure change. This mechanical information is then transduced to an electrical signal by means of a piezo-resistive, capacitors or other suitable methods and further processes.

In the case of a capacitive information transduction, the lamella forms a capacitor with a sidewall of the cavity opposing the lamella. In order to achieve a high sensitivity of this arrangement, the lamella needs to be thinned and the cavity needs to be narrow. In this manner, a large change of the electrode distance relative to an initial distance is achieved. Concurrently, the measurement range of the arrangement is thereby limited as a further increase of the pressure does not lead to a change in the capacity signal anymore, once the two electrodes are in contact with each other.

This problem may be circumvented by a manufacturer of capacitance-based pressure sensors offering a series of differently dimensioned (with respect to lamella thickness and/or cavity width). A user can then choose a suitable sensor for the intended application. It is possible that variations of pressure over a very large range need to be detected by employing several sensors that are each optimized for a subrange. Alternatively, a single sensor may cover the entire range, but at the expense of less sensitivity due to the use of a thicker lamella and/or of a wider cavity.

The problem of a limited measurement range can be solved by arranging the lamella in a tapered relation with respect to the opposing cavity sidewall, instead of in a parallel relation. Alternatively, the lamella may be shaped in a tapered form itself. As a further alternative, a combination of these variants may be used. The provision of a tapered cavity, lamella, or both, leads to an arrangement in which a highly sensitive transduction of the pressure signal can be observed in the first subrange, while in other subranges there remains a sufficient distance between the lamella and an opposite wall, in order to be able to detect a significantly larger pressure value. In other terms, the tapered cavity, gap, and/or lamella may confer a progressive sensitivity to the sensor (measured value small sensitivity high, and vice versa).

With a deep trench etching process, the dimensions and the shape of the cavities (or etching trenches) and of the lamellae (silicon mesa) can be defined by means of the lithography and the process parameters. For example, an etching trench for a lamella with a wedge-formed lateral cross-section can be obtained by means of lithography. By controlling the etching process, a wedge-formed cross-section in the vertical direction can be created. Furthermore, the etching depth varies with the width of the trench opening and the process parameters. Varying the process parameter during the etching allows for a more or less pronounced effect, so that a further degree of freedom in shaping the cavities and/or the lamellae is available.

According to the teachings disclosed herein, the cavity and/or the lamella of a pressure sensor are arranged such that surfaces that define the plates of a capacitor are not parallel to each other, but exhibit a tapered or wedge-like geometry. The expression "tapered" means that the cavity or the lamella has a varying thickness or width. The variation of the thickness or width is not limited to a linear variation, but may also assume other forms of variations, such as curved or stepped.

Figure 9:
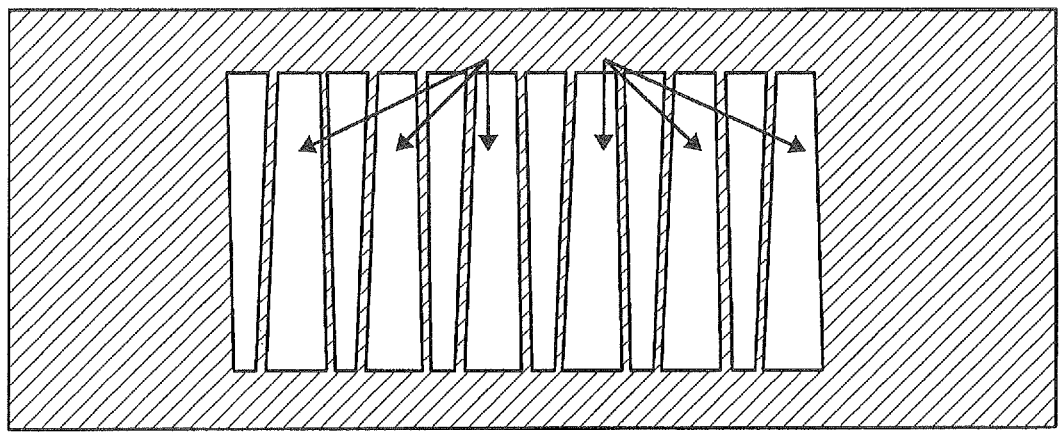
FIG. 9 shows a cross section through a substrate having cavities with tapered cross sections.

FIG. 9 shows a first variation where the lithography mask defines a trapezoid cross-section of the cavities. FIG. 9 is a cross-section through the substrate approximately at the position indicated by VIII-VIII in FIG. 8.

Figure 10:
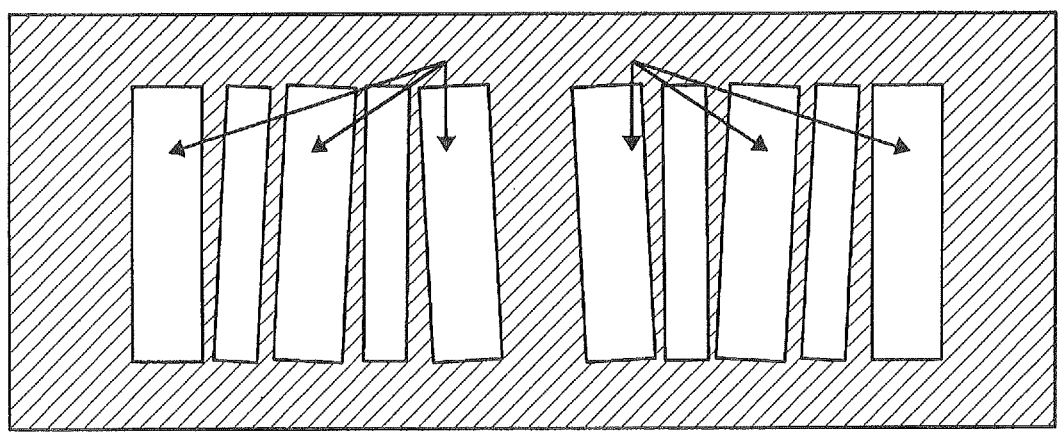
FIG. 10 shows a cross section through a semiconductor structure having cavities and tapered lamellae between the cavities.

FIG. 10 shows another variant in which the lithography mask defines a trapezoid cross-section for the lamella. The arrows in FIGS. 9 and 10 indicate which of the cavities are open to the backside of the second main surface 704 (cf. FIG. 8).

Many further implementations are possible. Not depicted in the drawings is for example an etch depth that varies over the cavity, which may be obtained by combining a lithography from FIG. 9 with an etching process that is strongly influenced by the trench width (shallow regions for narrow trench width, deep etchings for larger trench widths). Furthermore, it is not necessary to increase the widths linearly.

Figure 11:
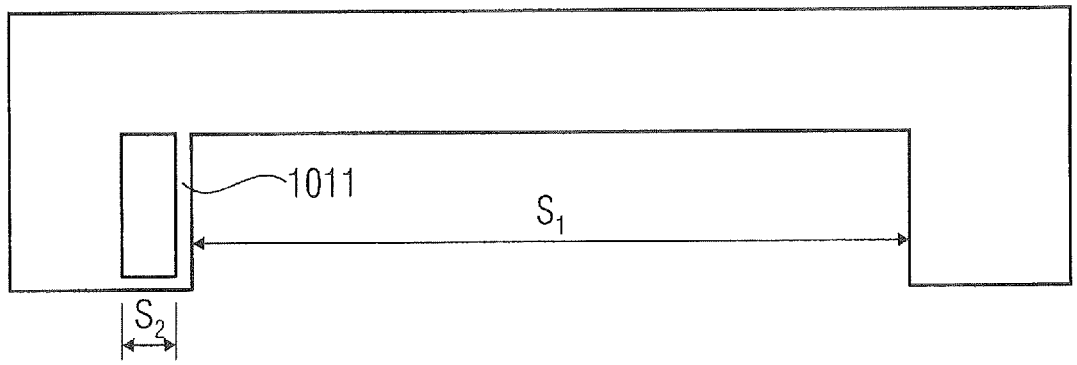
FIG. 11 shows a cross section through a semiconductor substrate to illustrate a relation of the dimensions of a first cavity and a second cavity.

FIG. 11 illustrates a schematic cross-section through the substrate with a first cavity and a second cavity. The first cavity has a width $s_1$ and the second cavity has a width $s_2$. As can be seen in FIG. 11, the width $s_1$ of the first cavity is larger than the width $s_2$ of the second cavity, by a factor greater than 10. Nevertheless, the lamella 1011 separating the first cavity from the second cavity is relatively thin and precisely dimensioned, which is important for sensor structures in order to obtain the desired measurement range and sensitivity.

Figure 12:
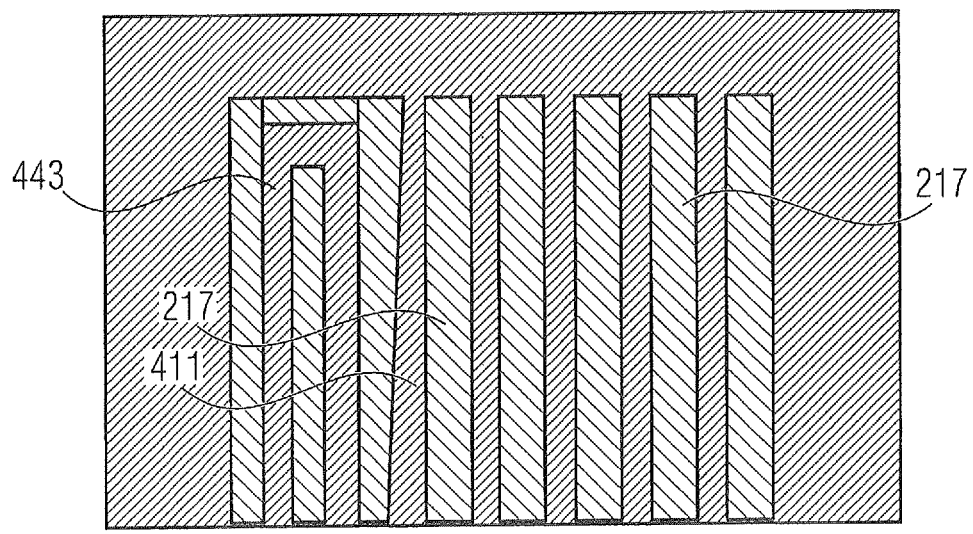
FIG. 12 illustrates a top view of a semiconductor substrate with a buried cavity, and an adjacent open cavity.
Figure 13:
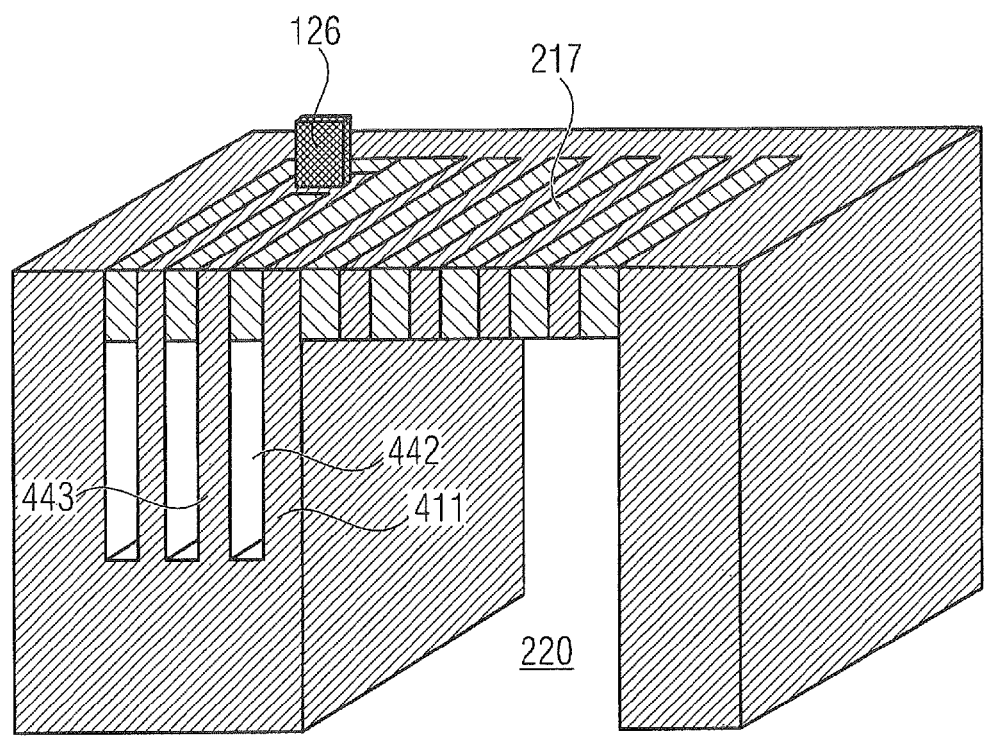
FIG. 13 illustrates a perspective cross section of a semiconductor structure comprising an electrical connection to an inner structure within a cavity.

FIGS. 12 and 13 illustrate a schematic top view of a semiconductor structure and a schematic perspective view of a cross section of the same structure, respectively. Among other things, FIG. 13 illustrates how an electrical connection to an inner structure can be provided when the inner structure is electrically isolated against the surrounding substrate. The large cavity 220 is adjacent to another cavity 442 which has a tapered cross-section. The large cavity 220 has been obtained for example by the method illustrated and explained in the context of FIGS. 2A and 2B. As can be seen in FIG. 13, five trenches shown in the right part of the drawing were used to obtain the large cavity 220 and were then closed with the closing material 217. FIGS. 12 and 13 show the closed remnants of these former five trenches. The first and the third trench of the plurality of trenches (when counting from the left) were used to define the other cavity 442. Except for the fact that the cavity 442 has a tapered cross section, it is similar to the cavity 442 in FIGS. 4A and 4B. The lamella 411 separates the large cavity 220 from the cavity 442. The lamella 411 has a tapered cross section, too, for example for the reasons explained in connection with FIGS. 9 and 10.

In the embodiment shown in FIGS. 12 and 13, the cavity 442 is a circumferential trench. The inner structure 443 substantially has a flat-tube configuration when viewed from above as in the top view of FIG. 12 (note that a front part of the inner structure 443 is not shown in FIG. 12). A direct connection between the inner structure 443 and the substrate is only provided at a lower end of the inner structure 443. At an upper end, the inner structure 443 is in contact with the closing material 217, only, except for an electrical connection 126 provided at the top end of the inner structure 443 (electrical connection not shown in FIG. 12). The closing material 217 acts like an electrical insulator between the inner structure 443 and the substrate. In order to completely electrically insulate the inner structure 443 at its lower end against the substrate, an insulating layer 632 may be provided at the lower end of the inner structure 443 proximal to a transition between the inner structure 443 and the substrate. For details about the insulating layer 632 and its creation, reference is made to FIGS. 6A to 7F and the corresponding description.

FIG. 14 illustrates how a semiconductor structure 1400 may be arranged on a wafer 1401. In a schematic manner, the semiconductor structure 1400 comprises a cavity 1412 which may be a closed cavity or an open cavity. The cavity 1412 is positioned close to a chip singulation trench 1420 so that only the lamella 1411 separates the cavity 1412 from the chip singulation trench 1420. Towards the end of a manufacturing process, the semiconductor structure 1400 will be singulated at the chip singulation trench 1420 as indicated by the dashed rectangle. As a result, the cavity 1412 will be close to an edge of the semiconductor structure 1400, e.g. close to a chip edge. Thus, the space around the semiconductor structure 1400 assumes the role of e.g. the pressure channel. No extra cavity to fulfill the role of the pressure channel is required in the case of a pressure sensor. The semiconductor structure 1400 may be mounted so that the chip edge proximal to the cavity 1412 is exposed to the medium of which a pressure is to be measured. The cavity 1412 serves as a reference volume. The cavity 1412 may be open to another side or surface of the semiconductor structure 1400 so that a differential pressure can be measured.

Embodiments provide sensors that are low-cost and integrated on a single chip with logic devices. Embodiments of the sensors are aggregated using CMOS fabrication processes. The sensor cavities and sense elements can be defined for the desired sensitivity and working range.

Although specific embodiments have been illustrated and described herein, it will be appreciated by those of ordinary skill in the art that a variety of ordinate and/or equivalent implementations may be substituted for the specific embodiments shown and described without departing from the scope of the present invention. This application is intended to cover any adaptation or variations of those specific embodiments discussed herein.

The invention claimed is:

1. A microelectromechanical sensor structure for transducing a mechanical quantity to an electrical quantity comprising:
   a substrate having a main surface;
   a first cavity formed in the substrate, wherein the first cavity is a pressure inlet; and
   a second cavity formed in the substrate proximate to the first cavity and separated by a lamella from the first cavity, wherein the second cavity is a closed pressure reference volume;
   wherein the first cavity has a first cavity dimension and the second cavity has a second cavity dimension, the first cavity dimension and the second cavity dimension extending in a direction parallel to the main surface, wherein a ratio between the first cavity dimension and the second cavity dimension is equal to or greater than 5.

2. The micromechanical sensor structure according to claim 1, wherein the ratio between the first cavity dimension and the second cavity dimension is equal to or greater than 10.

3. The microelectromechanical sensor structure according to claim 1, wherein the first cavity has a width between 1 µm to 1 mm and the second cavity has a width between 10 nm to 800 nm.

4. The microelectromechanical sensor structure according to claim 1, wherein the first cavity is open to the main surface of the substrate, and has an opening angle with respect to the main surface comprised in the range from 40 degrees to 140 degrees.

5. The microelectromechanical sensor structure according to claim 1, wherein the second cavity is lined with a liner material.

6. A semiconductor structure comprising:
   a semiconductor substrate; and
   a cavity within the semiconductor substrate and bounded by a bottom and a sidewall, wherein the bottom comprises a distinct section adjacent to a transition between the bottom and the sidewall, and solely the distinct section comprising a layer of a liner material and a layer of a main fill material different from a substrate material of the semiconductor substrate.

7. The semiconductor structure according to claim 6, wherein the fill material is at least one of an insulator material, a liner material, a silicon oxide, and a silicon nitride.

8. The semiconductor structure according to claim 6, wherein the distinct section comprises the layer of the liner material and the layer of the min fill material, the layers extending in a direction substantially perpendicular to the bottom of the cavity.

9. A microelectromechanical sensor structure for transducing a mechanical quantity to an electrical quantity comprising:
   a substrate having a main surface;
   a first cavity formed in the substrate; and
   a second cavity formed in the substrate proximate to the first cavity and separated by a lamella from the first cavity, wherein the second cavity is lined with a liner material;
   wherein the first cavity has a first cavity dimension and the second cavity has a second cavity dimension, the first cavity dimension and the second cavity dimension extending in a direction parallel to the main surface, wherein a ratio between the first cavity dimension and the second cavity dimension is equal to or greater than 5.

* * * * *